(12) United States Patent
Yu et al.

(10) Patent No.: US 12,062,603 B2
(45) Date of Patent: Aug. 13, 2024

(54) SEMICONDUCTOR DEVICE HAVING VIA SIDEWALL ADHESION WITH ENCAPSULANT

(71) Applicant: Taiwan Semiconductor Manufacturing Co., Ltd., Hsinchu (TW)

(72) Inventors: Chen-Hua Yu, Hsinchu (TW); Yun Chen Hsieh, Baoshan Township (TW); Hui-Jung Tsai, Hsinchu (TW); Hung-Jui Kuo, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/079,555

(22) Filed: Dec. 12, 2022

(65) Prior Publication Data

US 2023/0115729 A1 Apr. 13, 2023

Related U.S. Application Data

(60) Continuation of application No. 17/222,118, filed on Apr. 5, 2021, now Pat. No. 11,527,466, which is a
(Continued)

(51) Int. Cl.
*H01L 23/498* (2006.01)
*H01L 21/285* (2006.01)
(Continued)

(52) U.S. Cl.
CPC ...... *H01L 23/49827* (2013.01); *H01L 21/288* (2013.01); *H01L 21/32134* (2013.01);
(Continued)

(58) Field of Classification Search
CPC ............... H01L 23/481; H01L 23/5226; H01L 23/5389; H01L 24/04; H01L 24/13;
(Continued)

(56) References Cited

U.S. PATENT DOCUMENTS 8,159,070 B2  4/2012  Lin et al.
8,779,604 B1  7/2014  Cheng et al.
(Continued)

FOREIGN PATENT DOCUMENTS

CN   108122880 A   6/2018
TW   201044523 A   12/2010
TW   201436136 A   9/2014

*Primary Examiner* — Sonya McCall-Shepard
(74) *Attorney, Agent, or Firm* — Slater Matsil, LLP

(57) ABSTRACT

Embodiments include plating a contact feature in a first opening in a mask layer, the contact feature physically coupled to a contact pad, the contact feature partially filling the first opening. A solder cap is directly plated onto the contact feature in the first opening. The mask layer is then removed to expose an upper surface of a work piece, the contact feature vertically protruding from the work piece. After utilizing the solder cap, etching the solder cap to remove the solder cap from over the contact feature. A first encapsulant is deposited laterally around and over an upper surface of the contact feature. The first encapsulant is planarized to level an upper surface of the first encapsulant with the upper surface of the contact feature.

20 Claims, 12 Drawing Sheets

Related U.S. Application Data division of application No. 16/265,291, filed on Feb. 1, 2019, now Pat. No. 10,971,442.

(60) Provisional application No. 62/656,837, filed on Apr. 12, 2018.

(51) Int. Cl.
| | |
|---|---|
| *H01L 21/288* | (2006.01) |
| *H01L 21/3213* | (2006.01) |
| *H01L 21/48* | (2006.01) |
| *H01L 21/56* | (2006.01) |
| *H01L 21/66* | (2006.01) |
| *H01L 21/683* | (2006.01) |
| *H01L 21/768* | (2006.01) |
| *H01L 21/78* | (2006.01) |
| *H01L 23/00* | (2006.01) |
| *H01L 23/31* | (2006.01) |
| *H01L 23/48* | (2006.01) |
| *H01L 23/482* | (2006.01) |

(52) U.S. Cl.
CPC ...... *H01L 21/32136* (2013.01); *H01L 21/486* (2013.01); *H01L 21/561* (2013.01); *H01L 21/568* (2013.01); *H01L 21/6835* (2013.01); *H01L 21/76802* (2013.01); *H01L 21/7685* (2013.01); *H01L 21/76885* (2013.01); *H01L 21/78* (2013.01); *H01L 22/14* (2013.01); *H01L 23/3128* (2013.01); *H01L 23/481* (2013.01); *H01L 24/05* (2013.01); *H01L 24/19* (2013.01); *H01L 24/20* (2013.01); *H01L 24/96* (2013.01); *H01L 21/28568* (2013.01); *H01L 23/49866* (2013.01); *H01L 2221/68372* (2013.01); *H01L 2221/68381* (2013.01); *H01L 2224/95001* (2013.01); *H01L 2924/35121* (2013.01)

(58) Field of Classification Search
CPC ......... H01L 24/32; H01L 24/48; H01L 24/73; H01L 24/83; H01L 2224/0401; H01L 2224/04042; H01L 2224/13024; H01L 2224/214; H01L 2225/1058; H01L 2224/023; H01L 2224/0231; H01L 24/20; H01L 24/24; H01L 2224/24146; H01L 2224/73267; H01L 2224/92244; H01L 25/0657; H01L 2224/32145; H01L 2224/02331; H01L 22/14; H01L 24/82; H01L 2224/13082; H01L 2924/181; H01L 21/56; H01L 21/76802; H01L 21/76885; H01L 2224/02126; H01L 23/49827; H01L 21/486; H01L 21/288; H01L 2224/11462; H01L 2224/11464; H01L 21/32134; H01L 21/32136; H01L 2924/35121; H01L 21/7685; H01L 22/10–14; H01L 22/20; H01L 22/22; H01L 22/30; H01L 2224/11009

See application file for complete search history.

(56) References Cited

U.S. PATENT DOCUMENTS

| | | |
|---|---|---|
| 10,186,462 B2 | 1/2019 | Yu et al. |
| 2013/0127045 A1 | 5/2013 | Lin et al. |
| 2015/0076689 A1 | 3/2015 | Huang et al. |
| 2015/0311144 A1 | 10/2015 | Williams et al. |
| 2016/0276235 A1 | 9/2016 | Chen |
| 2017/0365564 A1* | 12/2017 | Yu .................. H01L 24/13 |
| 2018/0261573 A1 | 9/2018 | Chen et al. |

* cited by examiner

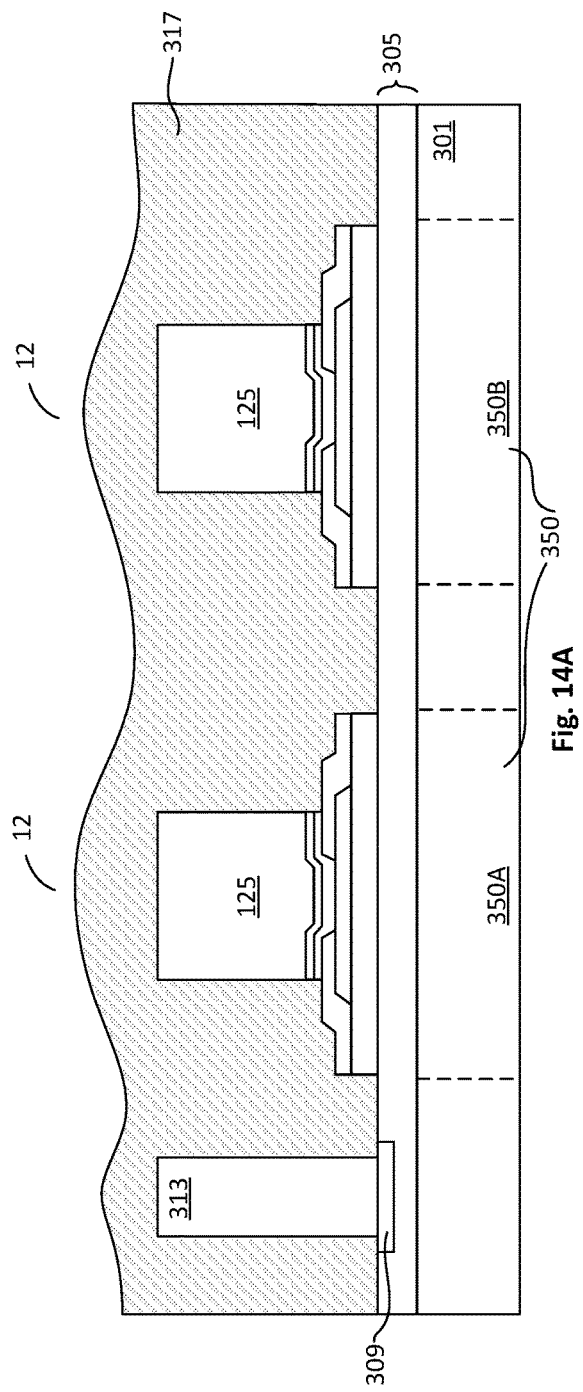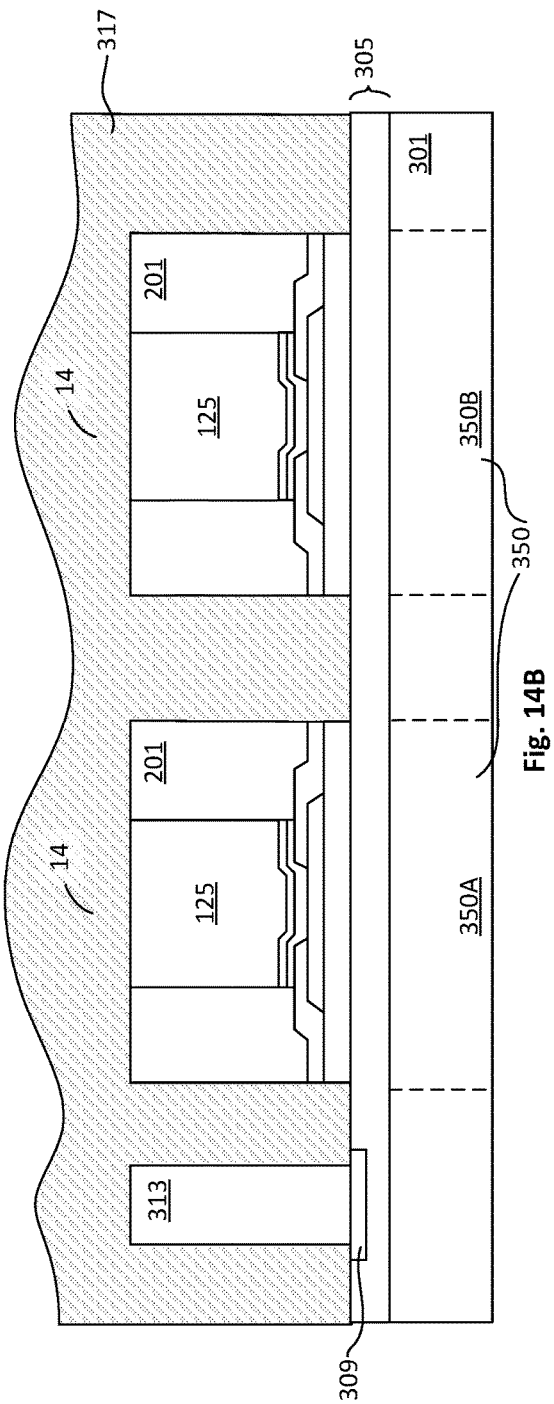

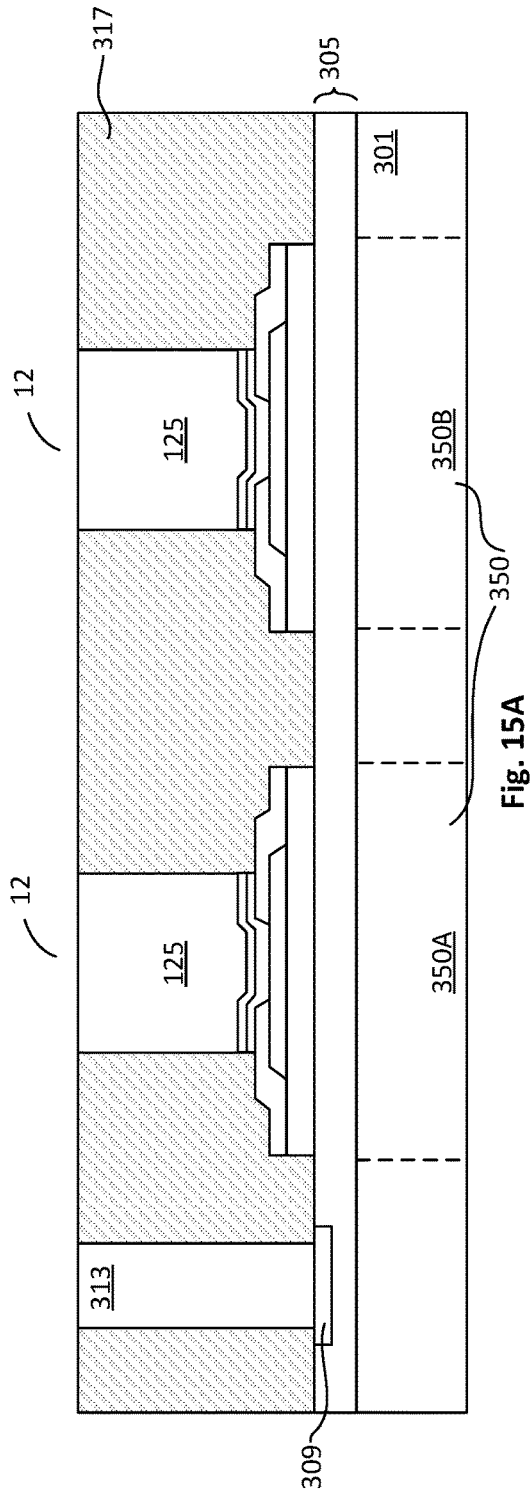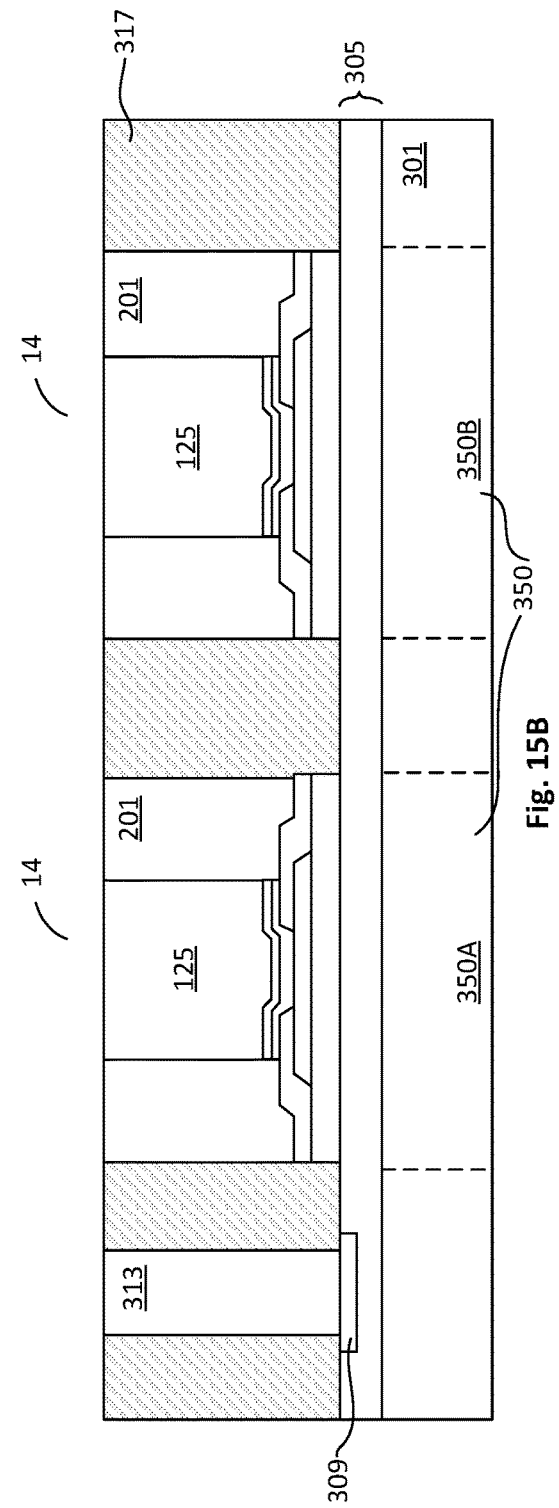

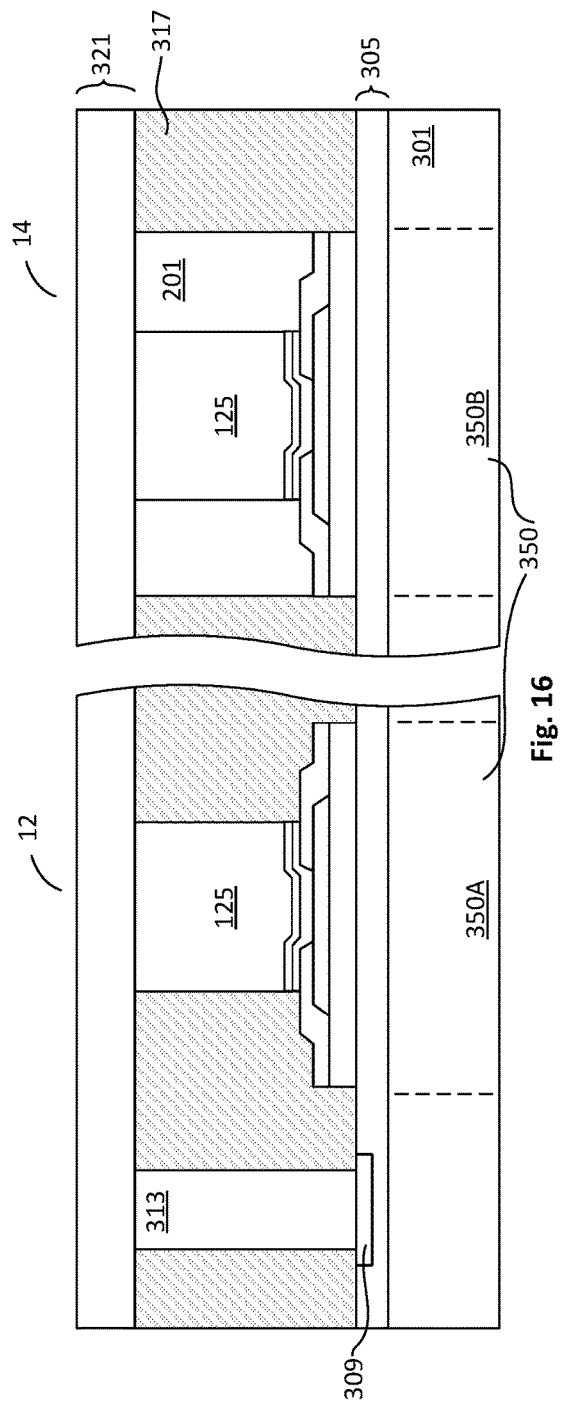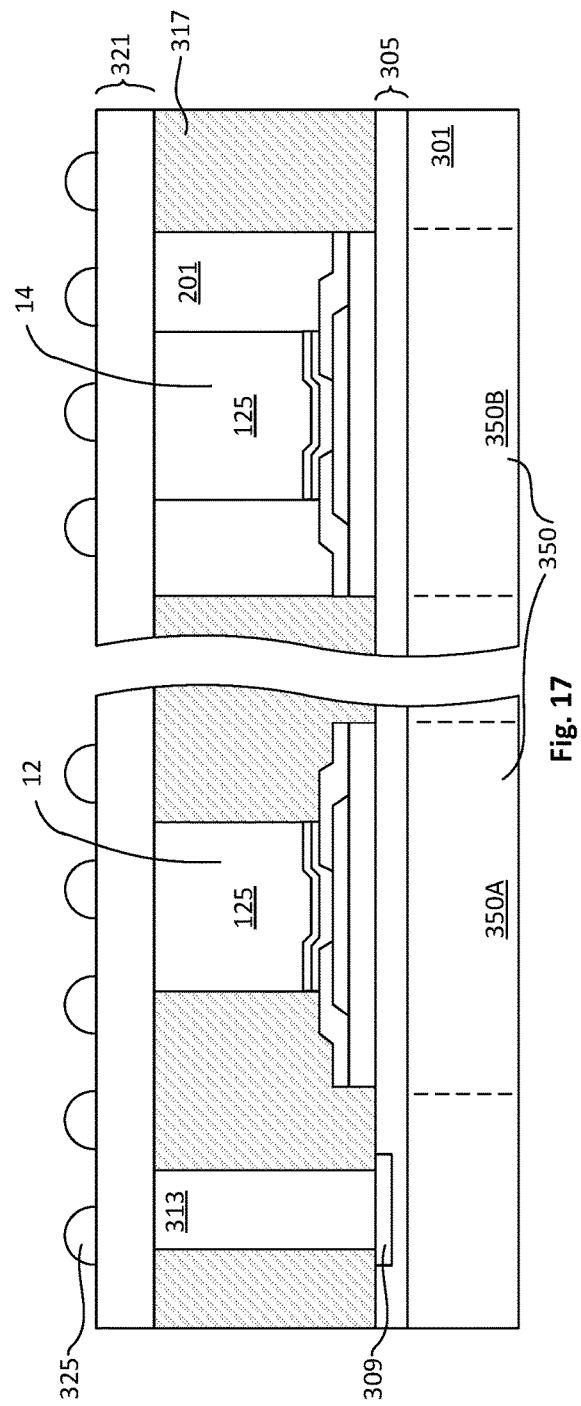

SEMICONDUCTOR DEVICE HAVING VIA SIDEWALL ADHESION WITH ENCAPSULANT

PRIORITY CLAIM AND CROSS-REFERENCE

This application is a continuation of U.S. patent application Ser. No. 17/222,118, filed on Apr. 5, 2021, which is a divisional of U.S. patent application Ser. No. 16/265,291, filed on Feb. 1, 2019, now U.S. Pat. No. 10,971,442, which claims the benefit of U.S. Provisional Application No. 62/656,837, filed on Apr. 12, 2018, entitled "Semiconductor Device Having Via Sidewall Adhesion With Encapsulant," which patent applications are incorporated herein by reference.

BACKGROUND

As modern integrated circuits shrink in size, the associated features shrink in size as well. As transistors shrink, features such as through vias and other interconnect elements shrink in size as well. In many instances, various layers of circuit on chips, dies, in packages, on PCBs and other substrates are interconnected between various layers by way of vias. Vias can be formed in openings through a substrate filled with a conductive metal. Typically, the vias are connected to traces or other conductive structures to permit non-aligned contact points in different layers to be connected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A, 13B, 14A, 14B, 15A, 15B, and 16 through 21 illustrate cross-sectional views of various intermediary stages of manufacturing a package including an embedded die, in accordance with various embodiments.

DETAILED DESCRIPTION

Figure 1:
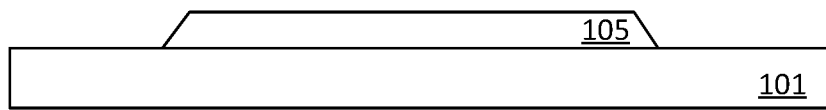
FIGS. 1-8 illustrate cross-sectional views of various intermediary stages of manufacturing dies, in accordance with embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments improve sidewall adhesion between a via formed over a die to a die pad and a surrounding encapsulant, such as a polymer or molding compound. Embodiments may use an encapsulant having thermal properties including a low coefficient of thermal expansion or low temperature curing to reduce the likelihood of delamination of the encapsulant from the sidewall of the via, especially where solder may be formed. Embodiments may also use an etching process prior to formation of the encapsulant to remove solder from sidewall of the via, so that the adhesion between the sidewall of the via and the encapsulant is improved, thereby reducing the likelihood of delamination of the encapsulant from the sidewall of the via. Embodiments which etch the solder may also provide a consistent interface to reduce in-line visual defects from solder residue which may be on top of and on the sidewall of the via.

FIGS. 1 through 19 illustrate cross-sectional views of various intermediary stages of manufacturing a package including an embedded die, in accordance with embodiments. FIGS. 1 through 8 illustrate the formation of a via on a die in accordance with some embodiments.

FIG. 1 illustrates a die 101 having one or more contact pads 105 formed thereon. Although only one contact pad is illustrated, it should be understood that additional contact pads may be formed over the surface of die 101. Die 101 may include be a passive device die, being substantially free of any active regions, or an active device die, including a substrate with at least one active device formed therein. The contact pads 105 may connect to different signal, power, and ground lines of die 101.

Die 101 may include a substrate, active devices, and an interconnect structure (not separately individually illustrated). The substrate of die 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate of die 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate of die 101 may be part of a wafer which after formation of the die, described below, is singulated into individual dies.

The substrate may include an active side where active devices such as transistors, diodes, photo-diodes, and the like may be formed, for example, at the top surface of the substrate of die 101. In some embodiments, passive devices (e.g., capacitors, resistors, fuses, and the like), may also be included at the top surface of the substrate of die 101 or in an overlying interconnect structure. The interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed therein using any suitable method. The ILD and/or IMD layers may include low-k dielectric materials having k values, for example, lower than about 4.0 or even 2.0 disposed between such conductive features. In some embodiments, the ILD and/or IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits of die 101. The functions provided by such circuits may include memory structures, processing structures, sensors, amplifiers, power distribution, input/output circuitry, or the like. One of ordinary skill in the art will appreciate that the above examples are provided for illustrative purposes only to further explain applications various embodiments and are not meant to limit the embodiments in any manner. Other circuitry may be used as appropriate for a given application.

I/O and passivation features may be formed over the interconnect structure of each active device die. For example, the contact pads 105 may be formed over the interconnect structure and may be electrically connected to the active devices through the various conductive features in the interconnect structure. The contact pads 105 may comprise a conductive material such as aluminum, copper, and the like.

Figure 2:
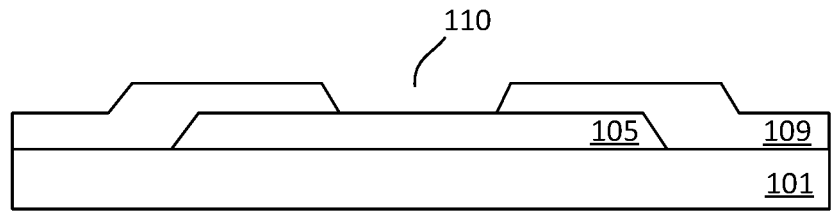

Referring to FIG. 2, one or more passivation layers 109 may be formed over the interconnect structures and the contact pads 105 and opening 110 formed therein to expose the contact pads 105. In some embodiments, the passivation layers 109 may be formed of non-organic materials such as silicon oxide, un-doped silicate glass, silicon oxynitride, and the like. Other suitable passivation materials may also be used. In some embodiments, the passivation layers may comprise a dielectric material such as SiN, another nitride, SiO, another oxide, or combinations thereof. Openings 110 may be formed using any suitable photolithographic process. Portions of the passivation layers 109 may remain and may cover edge portions of the contact pads 105. Additional interconnect features, such as additional passivation layers, conductive pillars, and/or under bump metallurgy (UBM) layers, may also be optionally formed over the contact pads.

The various features of die 101 may be formed by any suitable method and are not described in further detail herein. Furthermore, the general features and configuration of die 101 described above are but one example embodiment, and die 101 may include any combination of any number of the above features as well as other features.

Figure 3:
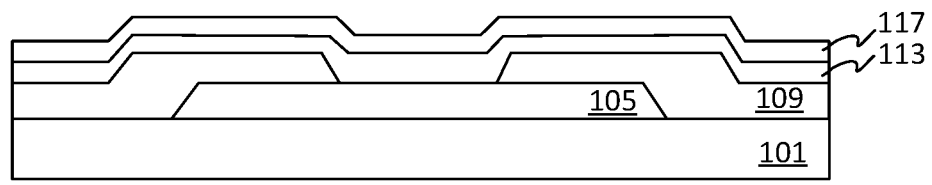

Referring now to FIGS. 3 through 8, a via is formed over each of the exposed contact pads 105. Although a particular process is described to form the vias, it should be understood that any suitable process may be used. In FIG. 3, a seed layer 113 is formed over passivation layer 109 and in openings 110 through passivation layer 109. In some embodiments, seed layer 113 is a metal layer. In some embodiments, one or more additional seed layers, such as seed layer 117, may be formed of different materials. In some embodiments, seed layer 113 may comprise a titanium layer and seed layer 117 may comprise a copper layer over the titanium layer. Seed layer 113 and seed layer 117 may be formed using, for example, PVD or the like.

Figure 4:
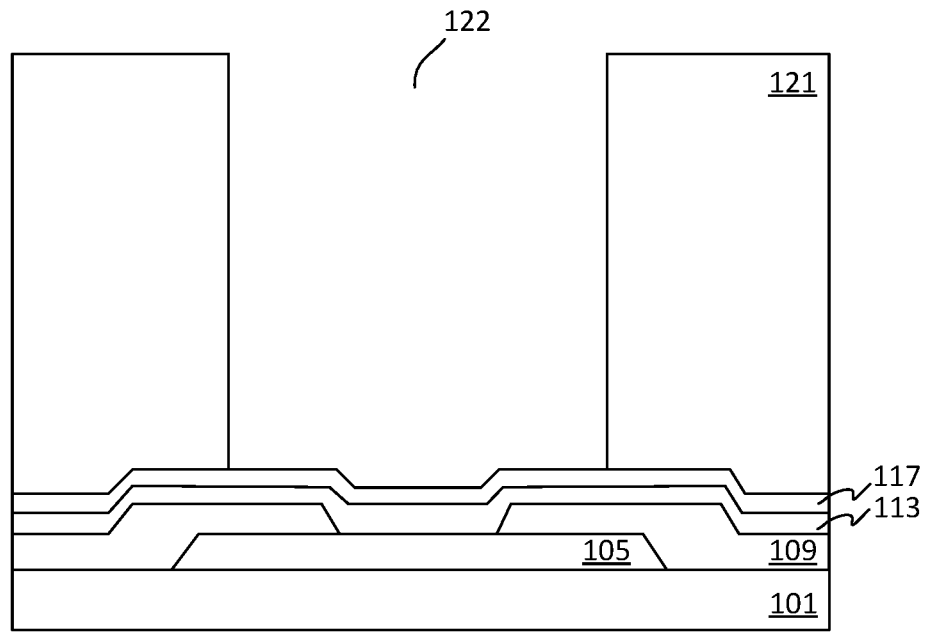

Referring now to FIG. 4, a photoresist 121 is then formed and patterned on seed layer 117. The photoresist 121 may be formed by spin coating or the like and may be exposed to light for patterning. The pattern of the photoresist corresponds to conductive vias to be formed over the contact pads 105. The patterning forms openings 122 through the photoresist to expose seed layer 117.

Figure 5:
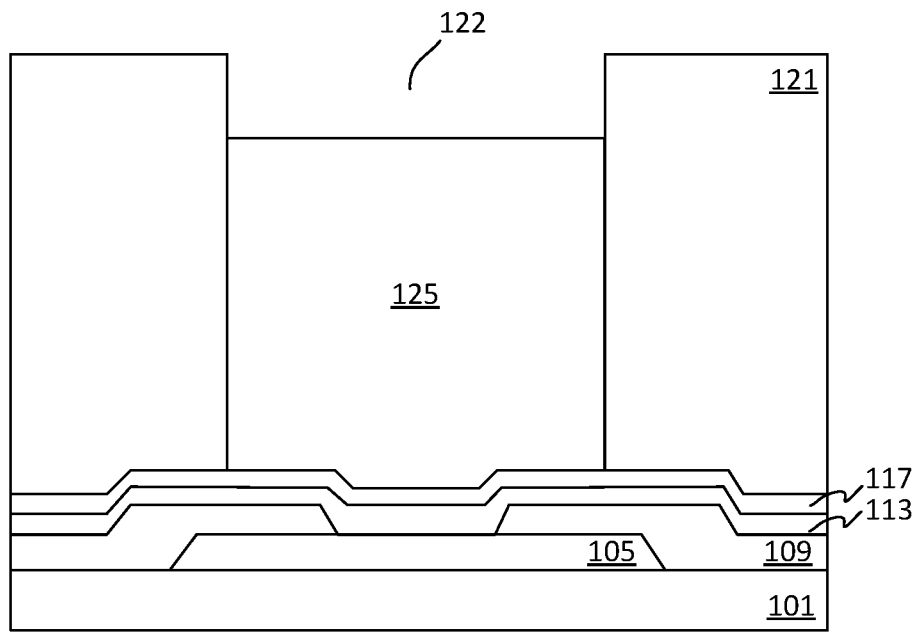

As illustrated in FIG. 5, a conductive via 125 (or metal pillar) is formed in the openings 122 of the photoresist 121 and on the exposed portions of seed layer 117. The conductive via 125 may be formed by plating, such as electroplating or electroless plating, or the like. The conductive via 125 may be a conductive material comprising a metal, like copper, titanium, gold, aluminum, tungsten, cobalt, palladium, nickel, silver, compounds or alloys of the same, or other conductive materials.

Figure 6:
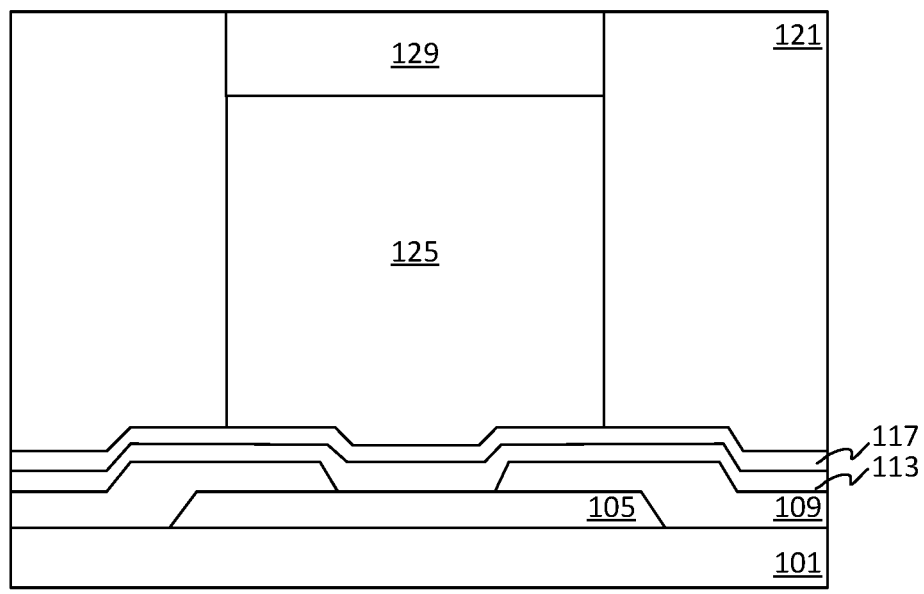

Referring to FIG. 6, a solder cap 129 is formed over the conductive via 125 in the openings 122 (see FIG. 5). In some embodiments, the solder cap 129 may be formed by plating, such as electroplating or electroless plating, or the like. In other embodiments the solder cap 129 may be formed by other means, such as by solder printing or the like. The solder cap 129 may be a conductive material comprising a metal other than the conductive via 125, such as a eutectic material like a solder having tin, lead, silver, or the like, or combinations thereof.

Figure 7:
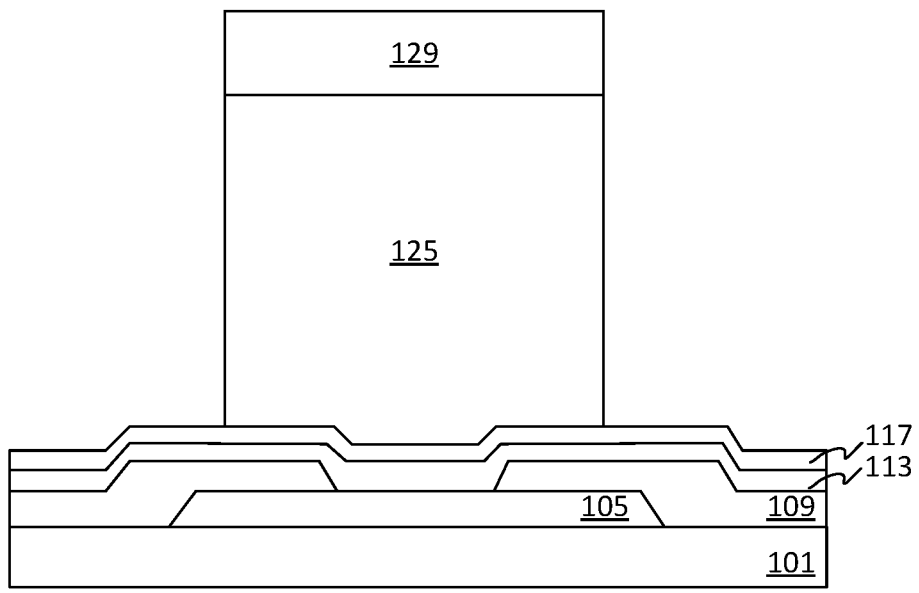
Figure 8:
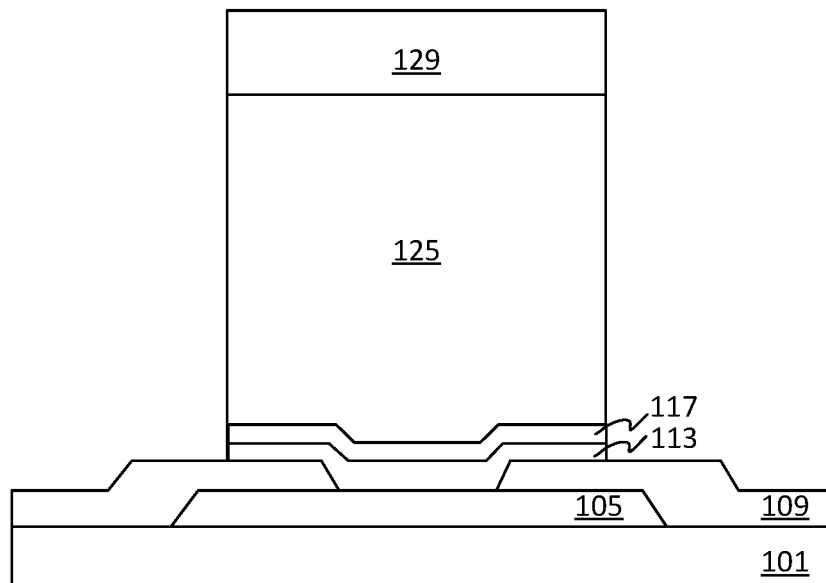

Referring to FIGS. 7 and 8, the photoresist 121 (see FIG. 6) and portions of seed layer 113 and seed layer 117 on which the conductive via 125 is not formed are removed. In FIG. 7, the photoresist 121 may be removed by an acceptable ashing or stripping process, such as using an oxygen plasma or the like. In FIG. 8, once the photoresist is removed, exposed portions of seed layer 113 and seed layer 117 are removed, such as by using an acceptable etching process, such as by wet or dry etching. The remaining portions of the seed layer 113, seed layer 117, and conductive via 125 form a conductive feature contacting contact pads 105.

In some instances, solder caps 129 may be used to cover the top surfaces of conductive vias 125, particularly over vias which may be prone to corrosion, contamination or surface imperfections arising from, for example, steps of the device or package fabrication process. Solder caps 129 may also be used to plate a dissimilar metal via to increase adhesion of subsequent layers or structures, or to alter the surface electrical properties of the via. For example, cobalt may be used to cap a copper via to provide resistance to corrosion and to prevent copper leaching into subsequent layers.

Figure 9:
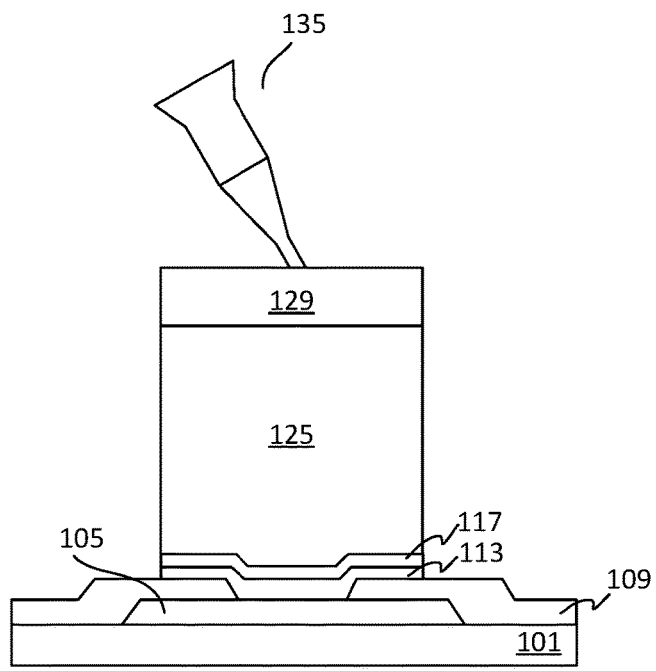
FIG. 9 illustrates a testing process, in accordance with some embodiments.

Referring to FIG. 9, solder cap 129 may be used for testing die 101. Die 101 may be tested by probes 135 or by a testing apparatus with probes 135 which engage the solder cap 129. Solder cap 129 provides a softer material to probe, which makes testing more reliable.

Figure 10A:
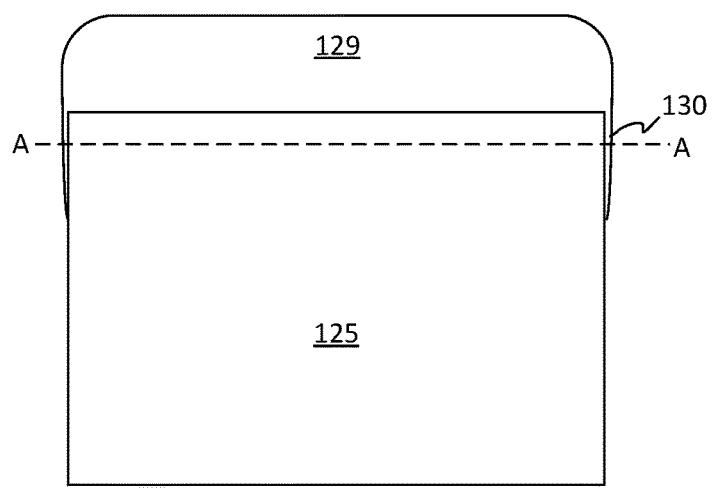
FIGS. 10A, 10B, 10C, and 10D illustrate various cross sectional views of a conductive via and solder cap at an intermediary stage of manufacturing a package including an embedded die, in accordance with some embodiments.

FIG. 10A illustrates an enlarged view of solder cap 129 over conductive via 125, in accordance with some embodiments. As illustrated, due to preceding processing steps, such as the ashing of photoresist 121 (see FIG. 6) or the etching of the seed layer 113 and seed layer 117 (see FIG. 8), the solder cap 129 may be deformed and may have reflowed. In this process, some solder wetting may occur on the sidewall of the conductive via 125, causing a sidewall solder portion 130 to form on the conductive via 125.

Figure 10B:
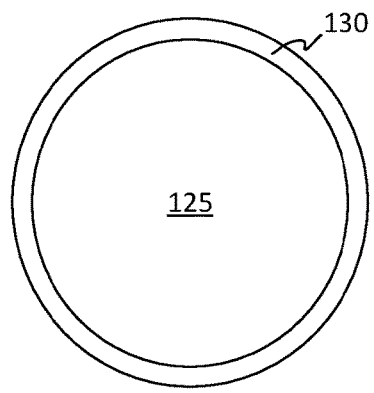

FIG. 10B is a horizontal cross section view of the conductive via 125 through the line A-A in FIG. 10A. As illustrated, a ring of solder in sidewall solder portion 130 may form adjacent to the sidewall of the conductive via 125.

An encapsulant may be formed surrounding the conductive via 125, however, due to the sidewall solder portion 130, issues may arise in subsequent processing, causing delamination at sidewall solder portion 130 or voids to form between the sidewall of the conductive via and surrounding encapsulating material. For example, when sidewall solder portion 130 remains, mismatch of the coefficients of thermal expansion (CTE) between the encapsulant (for example, see FIG. 12), sidewall solder portion 130, and conductive vias 125 can cause delamination. For example, the solder may have a CTE of about 21 parts per million per degree Celsius (ppm/° C.), the copper of the conductive via 125 may have a CTE of about 17 ppm/° C., and the encapsulant may have a CTE of about 44 ppm/° C. During curing of the encapsulant, the mismatch between each of these materials may cause delamination. Similarly, voids can form when the encapsulant is formed due to poor encapsulant wetting to the sidewall solder portion 130. If the solder cap 129 is removed by a grinding or polishing process, sidewall solder portions 130 can remain behind, causing line processing defects. For example, when the die 101 is inspected in an in line inspection process, the sidewall solder portions 130 may cause visual defect errors in processing and result in reduced yield.

Figure 11:
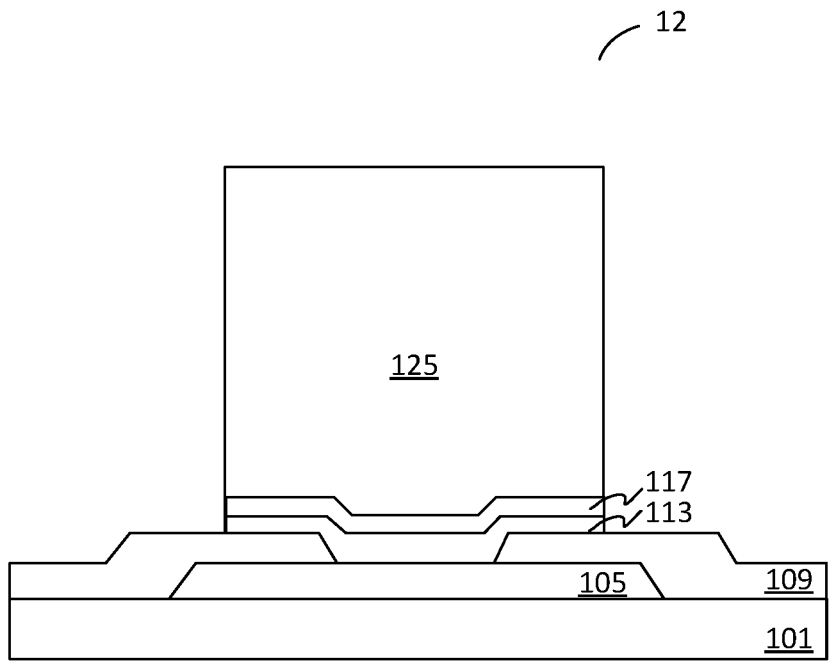
FIGS. 11 through 12 illustrate cross-sectional views of dies following removal of a solder cap in accordance with some embodiments.
Figure 12:
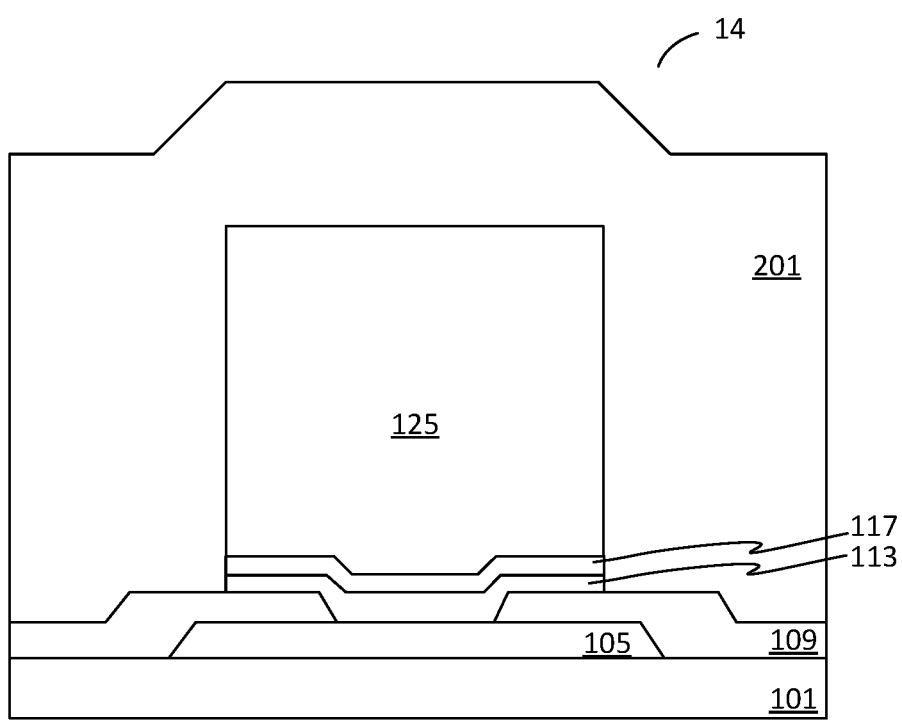

FIGS. 11 and 12 illustrate the removal of the solder cap 129 and optional encapsulation of the conductive via 125. With reference to FIG. 11, to prevent delamination and voids from forming, prior to encapsulating the conductive via 125, solder cap 129 is removed by an etching process using an etchant which has high selectivity between the material of solder cap 129 (e.g., tin) and the material of conductive via 125 (e.g., copper). Removing solder cap 129 prior to encapsulation allows better adhesion (or wetting) between the sidewall of the conductive via 125 and the encapsulant (see encapsulant 317 of FIG. 15A or encapsulant 201 of FIG. 15B), such as a polymer or molding compound.

The etching process used to remove solder cap 129 may be a wet etch or plasma etch. Suitable etching materials have a high selectivity between the material of solder cap 129 and the material of conductive via 125. In some embodiments, the etching materials may be selected so that the selectivity between the material of solder cap 129 and the material of conductive via 125 results in an etch rate ratio greater than about 10:1. Suitable etching materials may include chemicals selected for a wet etch including, for example, an oxidizer in acid, such as $H_2O_2$, $Cu^{2+}$, or $Fe^{3+}$ in $HNO_3$, $H_2SO_4$, or HCl. Combinations of these oxidizers and acids may be used. Other suitable oxidizers or acids may also be used. Suitable etching materials may include process gasses used in a plasm etch may including a mixing gas with a halogen gas, such as $Cl_2/Ar$, $Cl_2/O_2/Ar$, $F_2/Ar$, $F_2/Ar/O_2$, $I_2/Ar$, $I_2/Ar/O_2$, or combinations thereof. Other suitable mixing gasses and halogens may be used.

After the etching process, the solder of sidewall solder portion 130 (see FIGS. 10A and 10B) around the conductive via 125 may be substantially removed, resulting a better adhesion performance with a subsequently formed encapsulant. Embodiments which etch the solder cap 129 may also provide a consistent interface to reduce in-line visual defects from solder residue which may otherwise remain on top of and surrounding conductive via 125. In such embodiments, an interface between the sidewall of the conductive via 125 and the encapsulant (see, e.g., FIG. 12 encapsulant 201 or FIG. 14A encapsulant 317) may be substantially free of the material of the solder (e.g., including tin).

Figure 10C:
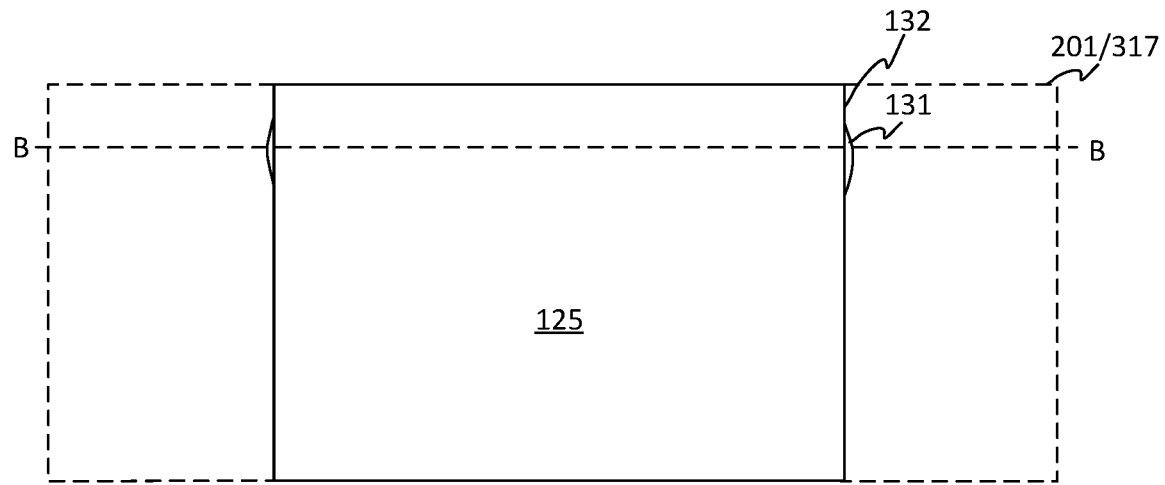
Figure 10D:
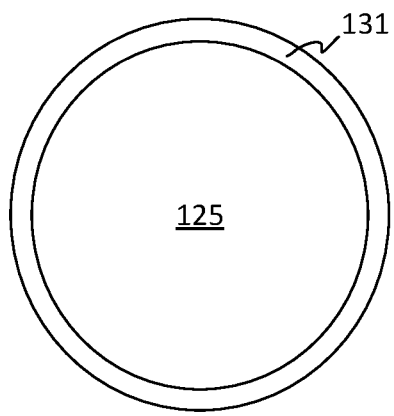

Referring to FIGS. 10C and 10D, cross-sections similar to FIGS. 10A and 10B are illustrated, respectively, following the etching of solder cap 129, in accordance with some embodiments. The cross-section in FIG. 10D is through the line B-B of FIG. 10C. In some embodiments, the etching process may partially remove the sidewall solder portion 130 while leaving some solder remaining on the sidewall of conductive via 125, resulting in solder residue 131. For example, the etching process may leave solder residue 131 on the sidewall of conductive via 125 below the top surface of conductive via 125. In such embodiments, the solder cap 129 which is over the top surface of conductive via 125 and part of the sidewall solder portion 130 near the top surface of conductive via 125 may be substantially removed while another part (solder residue 131) of the sidewall solder portion 130 may remain which is not as close to the top surface of conductive via 125 as the part that was removed. Top sidewall interface 132 is substantially free of solder which may reduce in-line visual defects and still provides improved adhesion, thereby reducing the risk of delamination or voids forming between conductive via 125 and a subsequently formed encapsulant (shown by dashed line representing encapsulant 201 (FIG. 12) or encapsulant 317 (FIG. 14A)).

Referring now to FIG. 12, after the etching process, an optional encapsulation process may be performed to laterally encapsulate conductive via 125 by an encapsulant 201, such as a polymer or molding compound. In embodiment processes, the material of the encapsulant 201 may be selected to have a reduced thermal mismatch between the via 125 and the encapsulant 201, explained in greater detail below.

Thermal mismatch can be caused by differences in the coefficient of thermal expansion (CTE) of the encapsulant 201 and the via 125. Thermal mismatch is also affected by the thermal budget required to form the material of encapsulant 201, for example to cure encapsulant 201. For example, a polymer encapsulant material may have a coefficient of thermal expansion (CTE) of about 9 parts per million per degree Celsius at room temperature (ppm/° C.) between about 40 and 70 parts per million per degree Celsius (ppm/° C.) which may be cured at a temperature of about 400° C. to reach 80% cyclization. Cyclization refers to the removal of solvent in a prepolymer and conversion of the prepolymer into its intractable state thereby forming the polymer. A level of 80% cyclization indicates that the conversion is 80% complete, which may be a suitable level of conversion needed for the polymer to attain desired physical properties, such as dielectric properties and the like.

In some embodiments, the material of encapsulant 201 may be selected or modified to have a CTE which is lower than other polymers or molding compounds, so that CTE mismatch is reduced between the via 125 and the encapsulant 201. For example, if the via 125 is copper, the CTE of the via 125 may be about 17 ppm/° C. The encapsulant 201 may have a CTE in a range of about 8 ppm/° C. to about 40 ppm/° C., such as about 9 ppm/° C. In some embodiments, the CTE of the encapsulant 201 may be between 0.5 and 2.5 times the CTE of the material of the via 125. In other words, the ratio of the CTE of the encapsulant 201 to the CTE of the via 125 may be between about 0.5:1 and about 2.5:1. Other acceptable ratio ranges are contemplated and may depend on the materials chosen for the via 125 and encapsulant 201. For example, the ratio of the CTE of the encapsulant 201 to the CTE of the via 125 may be between about 0.5:1 and about 2:1 or may be between about 1:1 and about 2:1, and so forth. Besides the possibility for CTE mismatch causing adhesion issues, some of the materials for encapsulant 201 and the materials for via 125 may provide better adhesion than others as a result of other physical properties.

In some embodiments, the material of the encapsulant 201 may be selected to have a curing temperature which is lower than other polymers or molding compounds so that the processing temperature may be reduced to form the encapsulant 201, for example, to achieve a suitable cyclization. In other words, the material of the encapsulant 201 may be selected to have a low thermal budget requirement necessary to form the encapsulant 201. In some embodiments, the material of encapsulant 201 may be selected to have a curing temperature which is between 100° C. and 250° C., such as about 200° C. to reach 80% cyclization. CTE of a polymer may increase at higher curing temperatures. Although CTE is typically expressed at room temperature, as done above, the CTE of an encapsulant 201, for example, may be about 9 ppm/° C. at room temperature and increase to about 44 ppm/° C. at 260° C. Therefore, the curing temperature may be selected to reduce the CTE mismatch between the via 125 and encapsulant 201 at the curing temperature.

Because thermal expansion of materials depends on temperature, a lower curing temperature also results in a lower expansion delta. The following example is not intended to be limiting, but is included for illustration purposes. Expansion of a copper via 125 having a CTE of about 17 ppm/° C. at 350° C. is calculated to be about 5950 ppm (or 0.595%). Expansion of a polymer having a CTE of about 55 ppm/° C. at 350° C. is calculated to be about 19,250 ppm (or 1.925%), a difference of 13,300 ppm (or 1.33%). At a lower temperature, such as 200° C., expansion of a copper via 125 is calculated to be about 3400 ppm (or 0.34%). If the polymer were modified to be processed at a lower temperature, a CTE of about 55 ppm/° C. at 200° C. is calculated to be about 11,000 ppm (or about 1.1%), a difference of 7600 ppm (or about 0.76%). In this case, even without adjusting the CTE of the encapsulant 201, the lower processing temperature would provide a 43% decrease (comparing 13,300 ppm to 7600 ppm, in this example) in effective thermal expansion mismatch.

In some embodiments, the encapsulant 201 may be selected or modified to have both a lower CTE and lower curing temperature. Through the selection of the encapsulant 201 to have a lower CTE or lower curing temperature (or both), the thermal mismatch is reduced between the via 125 and the encapsulant 201. In some embodiments, the encapsulant 201 and via 125 may be selected to have an effective thermal expansion mismatch of less than about 25 ppm/° C. (e.g., 5000 ppm at 200° C.). In other words, at a processing temperature required to form the encapsulant 201, the difference in the thermal expansion between the via 125 and the encapsulant 201 due to their different CTEs is less than about 0.5%. At a processing temperature of about 200° C., the difference in CTE is less than about 25 ppm/° C. At a processing temperature of about 250° C., the difference in CTE is less than about 20 ppm/° C.

The material of the encapsulant 201, in some embodiments, may be a polymer, such as polybenzoxazole (PBO), polyimide, benzocyclobutene (BCB), or the like. To achieve a lower thermal budget required to form the polymer, the polymer may be subject to backbone modification in which an element of the polymer backbone is substituted for an element of higher reactivity. Because the backbone has an element of higher reactivity, less thermal budget is required to reach a desired cyclization and achieve an intractable state (i.e., form the polymer). In a non-limiting example of backbone modification, a polymer precursor may be alkoxysilane, an aminosilane, or a cyclic type alkoxysilane-based precursor. The backbone of the resulting polymer may be modified to substitute another element in the place of one or more oxygen atoms during the formation of the polymer, for example, substituting sulfur by the combination of a sulfide with the precursor. Other suitable backbone modifications may be performed. In some embodiments, as a result of the backbone modification, the encapsulant 201 may reach over 80% cyclization under a curing temperature of between about 100° C. to about 250° C., such as about 200° C., whereas prior to the backbone modification a curing temperature of about 300 to about 400° C. would have been required to reach over 80% cyclization. The polymer backbone modification may therefore alter the thermal budget requirements of the material of the encapsulant 201.

To achieve a lower CTE, the encapsulant 201 may have a filler material added thereto, such as a nano-filler material. The filler material may include any suitable material. By way of example, the filler may comprise one or more of a ceramic, clay, silicon, carbon nano-tubes, graphene, or the like. The filler may be between about 1% by weight and about 20% by weight of the encapsulant 201, though this is not intended to be limiting and other percentages are contemplated.

Following the formation of encapsulant 201, the dies 14 may be singulated from a wafer. The lateral extents of encapsulant 201 may be the same as the lateral extents of the substrate of die 101. In other words, encapsulant 201 may extend to the lateral extents of dies 14.

Referring back to FIG. 11, following etching solder cap 129, in some embodiments, die 101 may be singulated from a wafer into dies 12. Referring to FIG. 12, in other embodiments, following etching solder cap 129, formation of encapsulant 201, and planarization, in some embodiments, die 101 may be singulated from a wafer into dies 14. In yet other embodiments, dies representative of dies 12 and dies representative of dies 14 may both be formed.

Figure 13A:
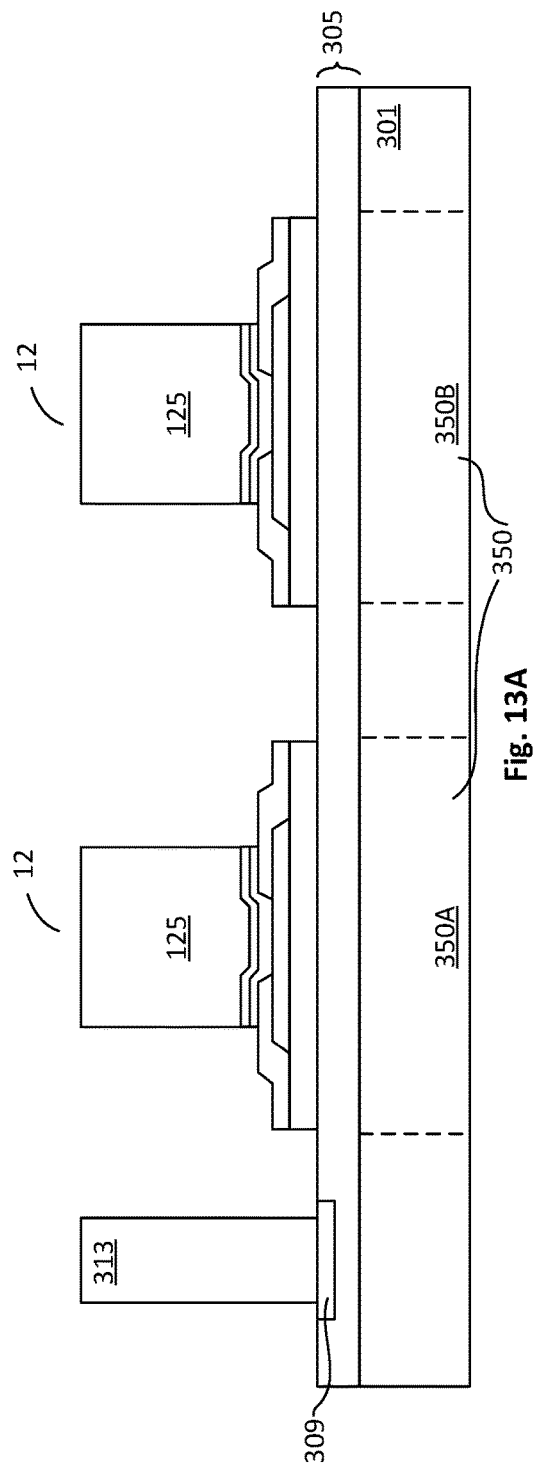

FIGS. 13A through 21 illustrate various intermediate steps in the formation of a package device using an embedded die, in accordance with some embodiments. Referring to FIG. 13A, singulated dies 12 may be attached to a carrier 301 by a die attach film (DAF) release layer (not shown). Carrier 301 includes at least two die placement regions 350 (labeled 350A and 350B). As will be described in greater detail below, features are formed on carrier 301 in various die placement regions 350, and features in each die placement region 350 are subsequently singulated from other features on carrier 301. Thus, multiple packages can be formed simultaneously.

Carrier 301 may be a glass carrier substrate, a ceramic carrier substrate, or the like. Carrier 301 may be a wafer, such that multiple IPD packages can be formed on the carrier 301 simultaneously. The release layer may be formed of a polymer-based material, which may be removed along with carrier 301 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV lights. The release layer may be dispensed as a liquid and cured or may be a laminate film laminated onto carrier 301. The top surface of the release layer may be leveled and may have a high degree of planarity.

In some embodiments, a backside redistribution structure 305 may be formed between the dies 12 and the carrier 301. In such embodiments, the release layer can attach the dies 12 to the redistribution structure 305. Redistribution structure 305 may include one or more redistribution layers (RDLs), which each include an ILD and/or IMD layer containing conductive features disposed therein (e.g., conductive lines and vias comprising copper, aluminum, tungsten, combinations thereof, and the like) which may be formed using any suitable method. The ILD and/or IMD layers may include low-k dielectric materials having k values, for example, lower than about 4.0 or even 2.0 disposed between such conductive features. In some embodiments, the ILD and/or IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). In some embodiments, backside redistribution structure 305 may be formed after removal of carrier 301 (see FIG. 18).

Conductive features of redistribution structure 305 may also include one or more contacts 309 formed at a surface thereof. Corresponding vias 313 may be formed over the one or more contacts 309 using any suitable process. The vias 313 may couple features from the backside redistribution structure 305 to a subsequently formed frontside redistribution structure or connector array (e.g., see FIG. 16). In some embodiments, the vias 313 may be formed for later processing. In one embodiment, for example, a photoresist (not shown) may be formed and patterned over the one or more contacts 309 to expose the one or more contacts 309 through openings in the photoresist. Vias 313 may be formed by plating, such as by electroplating or electroless plating, or the like. Vias 313 may be made of a conductive material comprising a metal, like copper, titanium, gold, aluminum, tungsten, cobalt, palladium, nickel, silver, compounds or alloys of the same, or other conductive materials. Following formation of the vias 313, the photoresist may be removed, for example, by an ashing process. In some embodiments a seed layer can be used prior to forming the photoresist, in which case, after ashing the photoresist, the remaining exposed seed layer may be removed.

Dies 12 may be placed in die placement regions 350 by a pick and place process and may be attached to redistribution structure 305 or carrier 301 by the release layer (discussed above).

Referring now to FIG. 14A, dies 12 may then be laterally encapsulated by an encapsulant 317 which may be a molding compound or other suitable material. The encapsulant 317 may have backbone modification which alters the thermal properties of the encapsulant 317, such as discussed above with respect to encapsulant 201. Encapsulant 317 may comprise an epoxy, a resin, a moldable polymer such as PBO, a molded underfill (MUF), or another moldable material. Encapsulant 317 may encircle dies 12 in a top-down view (not shown). In an embodiment, encapsulant 317 may be applied by compression molding, transfer molding, or the like. Encapsulant 317 may be applied in liquid form, and may be subsequently cured to provide a solid encapsulant.

Referring now to FIG. 15A, in an embodiment, encapsulant 317 may be applied to cover top surfaces of dies 12 and subsequently polished or ground to expose conductive vias 125 of dies 12 and planarize the top surfaces of the conductive vias 125 and the encapsulant 317. During the polishing or grinding, because the solder cap 129 (see FIG. 10A) has been removed by etching, the polishing will result in a smoother surface than if the solder cap 129 was present. The presence of solder cap 129 can cause beveling around the top surface of the conductive vias 125, resulting in in-line defects and causing a more uneven surface for subsequently formed front side RDLs (see FIG. 16).

Referring back now to FIG. 13B, singulated dies 14 (including encapsulant 201) (see FIG. 12) may be attached to a carrier 301 by a release layer (not shown), in accordance with some embodiments. Carrier 301 and the release layer may be configured similar to that discussed above with respect to FIG. 13A. Dies 14 may be placed in die placement regions 350 by a pick and place process and may be attached to the die placement regions 350 by the release layer.

In some embodiments, a backside redistribution structure 305 may be formed between the carrier 301 and encapsulated dies 14. The backside redistribution structure 305 may be formed using processes and materials such as those described above with respect to FIG. 13A. In some embodiments, the backside redistribution structure 305 may be formed after removal of carrier 301 (see FIG. 17).

In some embodiments, vias 313 may be formed using processes and materials similar to the formation of vias 313 of FIG. 13A which are not repeated. Vias 313 may couple features from the backside redistribution structure 305 (or carrier 301) to a subsequently formed front side redistribution structure or connector array (see FIG. 16).

Figure 13B:
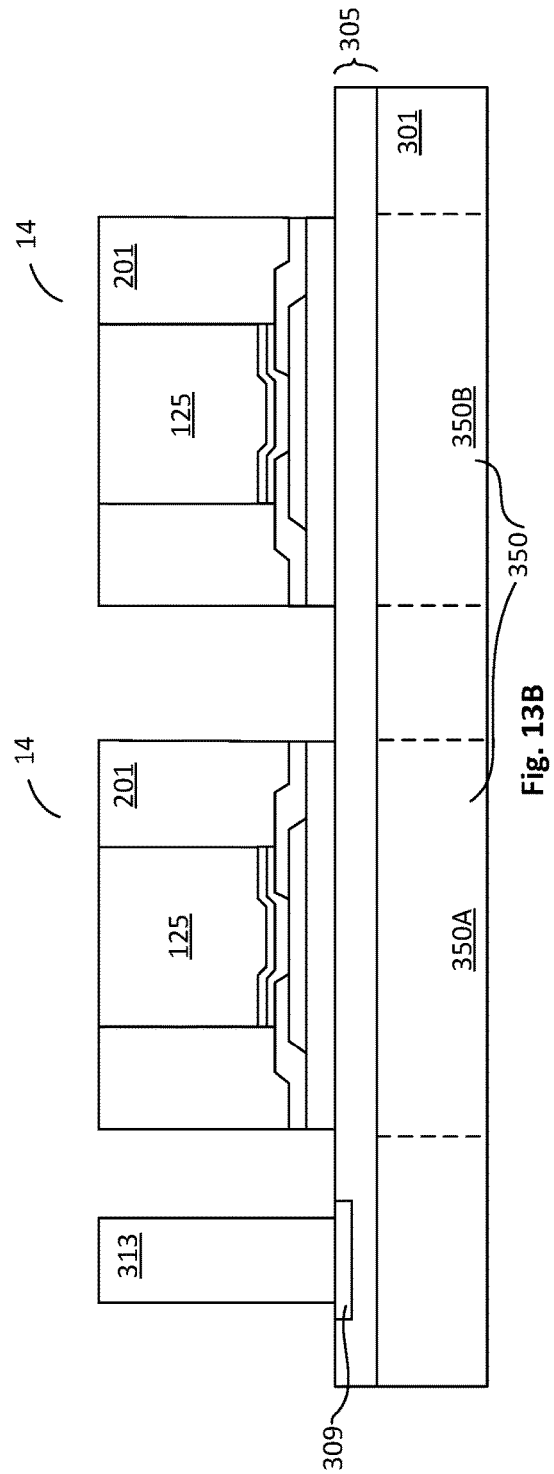

Still referring to FIG. 13B, following placement of the dies 14, in some embodiments the uppermost surfaces of the dies 14 may be leveled by a planarization process, such as by a chemical mechanical planarization (CMP) or other suitable process. The planarization process may be performed before or after formation of vias 313.

Referring to FIG. 14B, dies 14 may then be laterally encapsulated by an encapsulant 317 which may be a molding compound or other suitable material, such as described above with respect to FIG. 14A. In some embodiments, the encapsulant 317 may have backbone modification or fillers (or both backbone modification and fillers) which alter the thermal properties of the encapsulant 317, such as discussed above with respect to encapsulant 201. In other embodiments, the encapsulant 317 may not have backbone modification or fillers added to alter the thermal properties, such that a thermal mismatch may occur between the encapsulant 201 and encapsulant 317.

Referring to FIG. 15B, following the encapsulation of the dies 14 (including conductive via 125 and encapsulant 201) and vias 313 by the encapsulant 317, the top surfaces of the encapsulant 307, vias 313, and encapsulated dies 14 (including conductive via 125 and encapsulant 201) may be leveled by a planarization process, such as by a CMP or other suitable process. In some embodiments, the conductive via 125 and encapsulant 201 may be not be planarized in a separate step and instead be planarized in the same step as planarization of the encapsulant 301.

Typically, when the top surfaces are leveled, solder residue may provide different polishing rates between the metal of conductive via 125 and the residue from solder cap 129, which can cause beveling and in-line visual defects. However, in embodiment processes, etching the solder residue from solder cap 129 provides better wetting of the encapsulant 201 and results in a more consistent surface to perform planarization and further processing.

FIG. 16 illustrates the formation of a front side redistribution structure 321, in accordance with some embodiments. FIG. 16 illustrates a combined view of the structures illustrated in FIG. 13A (using dies 12) and FIG. 13B (using dies 14). One of ordinary skill will understand that carrier 301 may have dies 12 (not having the encapsulant 201), dies 14 (having the encapsulant 201), or combinations thereof on the same carrier 301. Redistribution structure 321 may include one or more redistribution layers (RDLs), which each may include an ILD and/or IMD layer containing conductive features disposed therein (e.g., conductive lines and vias comprising copper, aluminum, tungsten, combinations thereof, and the like) which may be formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Redistribution structure 321 may include a fan out RDL of an integrated fan-out (InFO) device.

Referring now to FIG. 17, optional connectors 325 may be formed on redistribution structure 321. In some embodiments, conductive features of redistribution structure 321 may be exposed by removing portions of the topmost dielectric layer of redistribution structure 321. Removing portions of dielectric layer 104 may include any suitable patterning and/or planarization process. After conductive features of redistribution structure 321 are exposed, connectors 325 are disposed on the conductive features of redistribution structure 321. Connectors 325 may be disposed in openings in the topmost dielectric layer of redistribution structure 321. In some embodiments, connectors 325 comprise solder balls, such as, microbumps, C4 bumps, BGA balls, and the like. This is but one example of forming connectors 325. One of skill will understand that connectors 325 may optionally not be formed or may be formed at a different step in the process.

Figure 18:
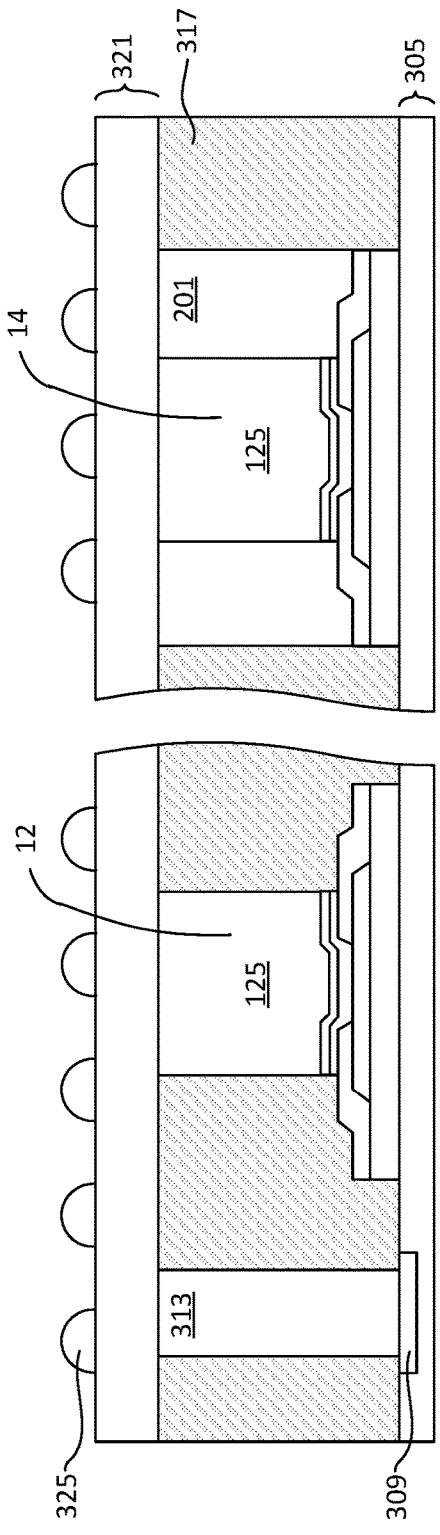

Referring now to FIG. 18, carrier 301 de-bonding is performed to detach (de-bond) carrier 301 from redistribution structure 305. In accordance with some embodiments, the de-bonding includes projecting a light such as a laser light or an UV light on the release layer so that the release layer decomposes under the heat of the light and carrier 301 can be removed.

Figure 19:
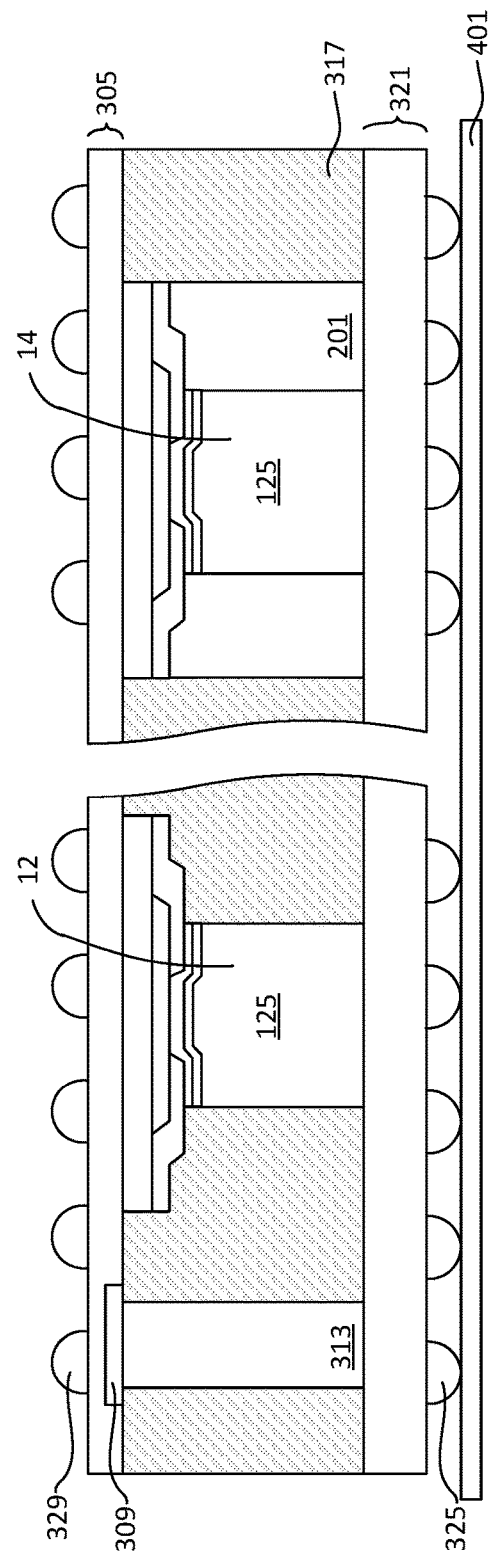

Referring to FIG. 19, the structure may be flipped over and placed on a tape 401. After carrier 301 is de-bonded, openings may be formed through the outermost dielectric layer of redistribution structure 305 to expose portions of conductive features within the redistribution structure 305, such as contact 309 or a conductive feature electrically coupled to contact 309. Openings may be formed, for example, using laser drilling, etching, or the like. Subsequently, as illustrated by FIG. 19, connectors 329 may be disposed in the openings in the outermost dielectric layer of redistribution structure 305. In some embodiments, connectors 329 comprise solder balls, such as, microbumps, C4 bumps, BGA balls, and the like.

Figure 20:
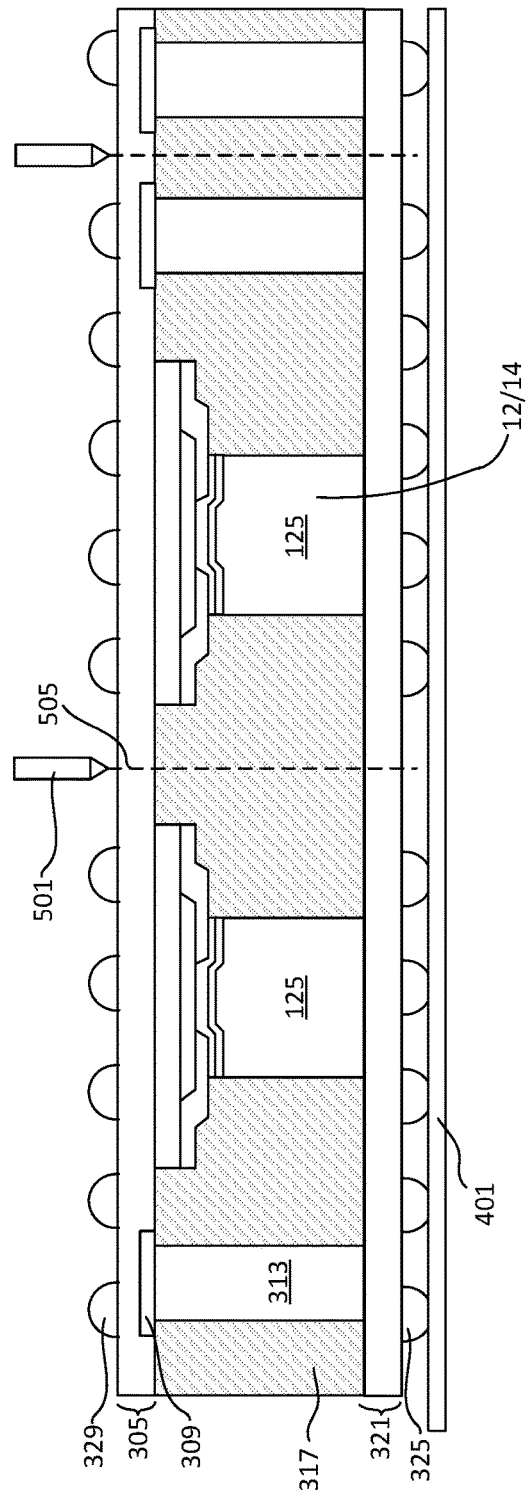

As illustrated in FIG. 20, a singulation process may be performed along scribe lines 505, e.g., between adjacent die placement regions 350 (labeled 350A and 350B, see FIGS. 16 and 17). Singulation may be performed using any suitable process using, for example, a mechanical saw/blade, a laser, combinations thereof, or the like (represented by element 501). In the illustrated embodiment, scribe line 505 does not extend through any conductive features in redistribution structure 305 and redistribution structure 321.

Figure 21:
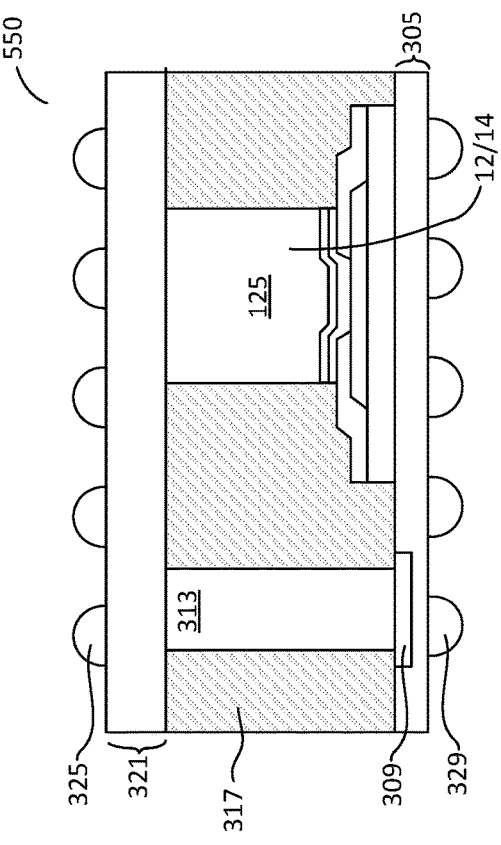

FIG. 21 illustrates the completed device package 550. Device package 550 includes a plurality of dies 12 (and/or dies 14) encapsulated in encapsulant 317. Redistribution structure 321 may include a fan-out RDL having conductive features which are electrically connected to dies 12 (and/or dies 14). Redistribution structure 321 may extend laterally past edges of dies 12 (and/or dies 14). In embodiments using dies 14, encapsulant 317 laterally encapsulates encapsulant 201 (see FIG. 19).

Embodiments provide for selecting an encapsulant such as a polymer or molding compound with a low CTE or low curing temperature (or both) to reduce the likelihood of delamination between the encapsulant and the via, where solder may remain on the sidewall of the via. Embodiments also provide for an etching process to remove the solder which is on the sidewall of the via of a die prior to encapsulation in an encapsulant to reduce the likelihood of delamination between the via sidewall and the encapsulant. The encapsulant may also be selected to have a low CTE or low curing temperature to further reduce the likelihood of delamination.

One embodiment includes a method, including forming a die, the die including a pad and a passivation layer over the pad. A first opening is formed through the passivation layer. A resist layer is deposited over the die. The resist layer is patterned to form a second opening aligned to the first opening. A via is formed in the second opening. A solder cap is formed on the via, where a first material of the solder cap flows to the sidewall of the via. The via is encapsulated in a first encapsulant, where the first encapsulant has a CTE where the ratio of the CTE of the first encapsulant to the CTE of the via is less than 2.5:1 or where the first encapsulant has a curing temperature less than 250° C.

Another embodiment includes a method, including disposing a metal pillar over and coupled to a contact pad of a die, the metal pillar comprising a first material. A solder cap is formed over the metal pillar, the solder cap comprising a second material. The solder cap is etched using an etchant having selectivity between second material and the first material. The die is attached to a carrier.

Another embodiment includes a package, including an embedded die having a plurality of contact pads formed at an active side thereof. A metal via is disposed over a corresponding contact pad of the plurality of contact pads. A first encapsulant laterally encapsulates the metal via, where the first encapsulant contacts the sidewall of the metal via, and where an interface between the sidewall of the metal via and the first encapsulant is free of tin adjacent to a top surface of the metal via.

Another embodiment is a package including an embedded die having a contact pad formed at an active side thereof. The package also includes a metal via disposed over the contact pad. The package also includes a first encapsulant laterally encapsulating the metal via, where the first encapsulant contacts a sidewall of the metal via, where a first interface between the sidewall of the metal via and the first encapsulant is free of solder, the first interface adjacent to a top surface of the metal via, where solder is disposed on a sidewall of the metal via between the sidewall of the metal via and the encapsulant below the first interface.

Another embodiment is a device including a contact pad over a substrate of a die. The device also includes a metal pillar disposed on the contact pad, the metal pillar including solder residue disposed on a sidewall of the metal pillar. The device also includes a first encapsulant laterally surrounding the metal pillar, the first encapsulant contacting the solder residue, the first encapsulant extending laterally to an edge of the die.

Another embodiment is a package device including a first redistribution structure, the first redistribution structure including a metallization. The package device also includes a first metal pillar disposed on the metallization, the first metal pillar extending vertically away from the first redistribution structure. The package device also includes a first die attached to the first redistribution structure, the first die including a second metal pillar disposed on the first die. The package device also includes a solder residue disposed on a side wall of the second metal pillar. The package device also includes a first encapsulant surrounding the second metal pillar and contacting the solder residue.

Another embodiment is a method including patterning a first opening in a first layer disposed over a contact pad, the contact pad at a front side of a work piece. The method also includes plating a contact feature in the first opening, the contact feature physically coupled to the contact pad, the contact feature partially filling the first opening. The method also includes plating a solder cap directly on the contact feature in the first opening. The method also includes removing the first layer to expose an upper surface of the work piece, the contact feature vertically protruding from the work piece. The method also includes utilizing the solder cap. The method also includes after utilizing the solder cap, etching the solder cap to remove the solder cap from over the contact feature. The method also includes depositing a first encapsulant laterally around and over an upper surface of the contact feature. The method also includes planarizing the first encapsulant to level an upper surface of the first encapsulant with the upper surface of the contact feature, where following the planarizing, an interface around the upper surface of the contact feature between the contact feature and the first encapsulant is free of solder material.

Another embodiment is a method including etching a solder cap to remove the solder cap from over a conductive pillar, the conductive pillar protruding from a first structure, the conductive pillar extending vertically from a contact pad of the first structure. The method also includes after etching the solder cap, depositing a first encapsulant to laterally surround the conductive pillar with the first encapsulant. The method also includes attaching a nonconductive side of the first structure to a second structure. The method also includes forming a redistribution structure over the first structure, the redistribution structure electrically coupled to the first structure.

Another embodiment is a method including removing a solder bump from an upper surface of a metal pillar, the metal pillar extending through a passivation layer to contact a metal pad of a die, the metal pillar protruding vertically from the metal pad, a solder residue remaining on a sidewall of the metal pillar. The method also includes singulating the die from a wafer. The method also includes depositing a first encapsulant laterally surrounding and over an upper surface of the metal pillar. The method also includes performing a planarization process on the first encapsulant to level an upper surface of the first encapsulant with the upper surface of the metal pillar, where following the planarization process, the upper surface of the first encapsulant is free from solder materials and the solder residue is encased in the first encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a first opening in a first layer disposed over a contact pad, the contact pad at a front side of a work piece;
    plating a contact feature in the first opening, the contact feature physically coupled to the contact pad, the contact feature partially filling the first opening;
    plating a solder cap directly on the contact feature in the first opening;
    removing the first layer to expose an upper surface of the work piece, the contact feature vertically protruding from the work piece;
    utilizing the solder cap;
    after utilizing the solder cap, etching the solder cap to remove the solder cap from over the contact feature;
    depositing a first encapsulant laterally around and over an upper surface of the contact feature; and
    planarizing the first encapsulant to level an upper surface of the first encapsulant with the upper surface of the contact feature, wherein following the planarizing, an interface around the upper surface of the contact feature between the contact feature and the first encapsulant is free of solder material.

2. The method of claim 1, wherein the contact feature has a first CTE and the first encapsulant has a second CTE, wherein a ratio of the second CTE to the first CTE is less than 2.5:1.

3. The method of claim 1, further comprising:
    curing the first encapsulant at a temperature less than 250° C.

4. The method of claim 1, wherein following the etching of the solder cap, a solder material remains on a sidewall of the contact feature away from the upper surface of the contact feature, the solder material encapsulated by the first encapsulant.

5. The method of claim 1, wherein utilizing the solder cap includes probing the solder cap to test an electrical capability of the contact feature.

6. The method of claim 1, further comprising:
    singulating a chip from the work piece;
    attaching the chip over a redistribution structure of a second work piece, the chip adjacent a conductive pillar extending vertically from the redistribution structure; and
    encapsulating the chip in a second encapsulant.

7. The method of claim 6, wherein the second encapsulant and the first encapsulant refer to the same encapsulant.

8. The method of claim 6, wherein the second encapsulant has a vertical interface with the first encapsulant, the vertical interface aligned to an edge of the chip.

9. A method comprising:
   etching a solder cap to remove the solder cap from over a conductive pillar, the conductive pillar protruding from a first structure, the conductive pillar extending vertically from a contact pad of the first structure, the conductive pillar and the contact pad being disposed on a first side of the first structure;
   after etching the solder cap, depositing a first encapsulant to laterally surround the conductive pillar with the first encapsulant;
   after depositing the first encapsulant, attaching a second side of the first structure to a second structure, wherein the second side of the first structure is opposite to the first side of the first structure; and
   after attaching the second side of the first structure to the second structure, forming a redistribution structure over the first structure, the redistribution structure electrically coupled to the first structure.

10. The method of claim 9, further comprising:
    prior to etching the solder cap, testing a device embedded in the first structure by probing the solder cap.

11. The method of claim 9, further comprising:
    prior to depositing the first encapsulant, singulating the first structure from a wafer.

12. The method of claim 9, wherein the first encapsulant is a polymer or molding compound, the first encapsulant having a first co-efficient of thermal expansion (CTE) between less than 2.5 times a second CTE of the conductive pillar.

13. The method of claim 9, further comprising:
    forming the first encapsulant at a temperature of less than 250° C.

14. The method of claim 9, further comprising:
    after depositing the first encapsulant, singulating the first structure from a wafer; and
    prior to forming the redistribution structure, depositing a second encapsulant to laterally surround the first structure.

15. The method of claim 9, further comprising:
    after depositing the first encapsulant, performing a planarization process to level an upper surface of the conductive pillar with an upper surface of the first encapsulant, wherein following the planarization process, the upper surface of the first encapsulant is free from solder material.

16. A method comprising:
    removing a solder bump from an upper surface of a metal pillar, the metal pillar extending through a passivation layer to contact a metal pad of a die, the metal pillar protruding vertically from the metal pad, a solder residue remaining on a sidewall of the metal pillar;
    singulating the die from a wafer;
    depositing a first encapsulant laterally surrounding and over an upper surface of the metal pillar; and
    performing a planarization process on the first encapsulant to level an upper surface of the first encapsulant with the upper surface of the metal pillar, wherein following the planarization process, the upper surface of the first encapsulant is free from solder materials and the solder residue is encased in the first encapsulant.

17. The method of claim 16, wherein depositing the metal pillar with the first encapsulant is performed prior to attaching the die to a carrier, further comprising:
    depositing a second encapsulant to laterally surround the first encapsulant and extending down a sidewall of the die.

18. The method of claim 16, wherein the first encapsulant reaches 80% cyclization at a cure temperature between 100° C. and 250° C.

19. The method of claim 16, wherein the first encapsulant comprises a first polymer and a first nanofiller additive, wherein the first nanofiller additive reduces a coefficient of thermal expansion of the first encapsulant.

20. The method of claim 16, wherein the first encapsulant is comprises a modified polymer having a coefficient of thermal expansion less than about 0.5% of a coefficient of thermal expansion of a material of the metal pillar.

* * * * *